United States Patent [19]

Miwa

[11] Patent Number: 5,079,717
[45] Date of Patent: Jan. 7, 1992

[54] METHOD AND SYSTEM FOR COMPACTION-PROCESSING MASK PATTERN DATA OF A SEMICONDUCTOR INTEGRATED CIRCUIT DEVICE

[75] Inventor: Hisaharu Miwa, Itami, Japan

[73] Assignee: Mitsubishi Denki Kabushiki Kaisha, Japan

[21] Appl. No.: 299,475

[22] Filed: Jan. 18, 1989

[30] Foreign Application Priority Data

Oct. 26, 1988 [JP] Japan .................................. 63-268121

[51] Int. Cl.$^5$ ............................................. G06F 15/60
[52] U.S. Cl. .................................. 364/490; 364/489; 364/488
[58] Field of Search ................ 364/488, 489, 490, 491

[56] References Cited

U.S. PATENT DOCUMENTS 4,500,963  2/1985  Smith et al. ......................... 364/491

OTHER PUBLICATIONS

"Compaction Based Custom LSI Layout Design Method", by M. Ishikawa et al., IEEE ICCAD-85, Nov. 18-Nov. 21, 1985, pp. 343-345.
"EXCL: A Circuit Extractor for IC Designs", by S. P. McCormick, IEEE 21st Design Automation Conf., 1984, pp. 616-623.
Nogatch et al., "Automated Design of CMOS Leaf Cells", VLSI Systems Design, Nov. 1985, pp. 66-78.
"Graph-Optimization Techniques for IC Layout and Compaction", Kedem et al.; IEEE Transactions on Computer-Aided Design, vol. CAD-3, No. 1, Jan. 1984.
"Plowing: Interactive Stretching and Compaction in Magic", Scott et al.; Computer Science Division, University of California; 1984.

*Primary Examiner*—Parshotam S. Lall
*Assistant Examiner*—V. N. Trans
*Attorney, Agent, or Firm*—Leydig, Voit & Mayer

[57] ABSTRACT

A method for producing a mask pattern for a semiconductor integrated circuit includes dividing the mask pattern data into a plurality of lower level cells and an upper level cell having wiring lines for providing connections between the lower level cells, extracting inter-cell connection information from the mask pattern data, changing the dimensions of the lower level cells by predetermined ratios to conform to a design standard, and changing the wiring lines of the upper level cell to retain the connection between the lower level cells in accordance with the inter-cell connection information extracted.

3 Claims, 8 Drawing Sheets

METHOD AND SYSTEM FOR COMPACTION-PROCESSING MASK PATTERN DATA OF A SEMICONDUCTOR INTEGRATED CIRCUIT DEVICE

BACKGROUND OF THE INVENTION

1. Field of the Invention

This invention relates to a method and a system for compaction-processing mask pattern data for a semiconductor integrated circuit device such as an LSI for the purpose of preparing mask pattern of a semiconductor integrated circuit device of different design standards (dimension standards), and in particular, to a method and a system for obtaining mask pattern data for LSIs of small size design standards from LSI mask pattern data having a hierarchical structure.

2. Description of the Related Art

With the recent progress in the art of manufacturing semiconductors, a substantial reduction in the dimensions of various parts composing a semiconductor integrated circuit device has been aimed at, with the result that the integration degree of such devices is becoming higher and higher. In other words, more and more semiconductor integrated circuit devices of modified design standards, i.e. those with parts having reduced dimensions, are being required to be manufactured. The mask pattern of a semiconductor integrated circuit device whose design standard has been thus modified can be obtained by compaction-processing the mask pattern of the existing semiconductor integrated circuit device.

FIG. 8 shows a conventional mask pattern layout system utilized for preparing the mask pattern of an LSI through compaction-processing. The system includes a central processing unit (hereinafter referred to as CPU) 1. Connected to this CPU 1 are a graphic display device 2 for displaying LSI mask patterns, a keyboard device 3 for inputting various instructions, and a magnetic disc device 4 for storing LSI mask pattern data.

In designing an LSI mask pattern, the entire pattern is normally divided into a number of definite units, the design work being individually conducted for each of such units. Accordingly, LSI mask pattern data constitute a hierarchical structure which is composed, as shown in FIG. 9 by way of example, of lower-level cells 5 through 7 and a higher-level cell 9 including a wiring zone 8 between the lower-level cells 5 through 7. The magnetic disc device 4 stores LSI mask pattern data having such a hierarchical structure.

Here, the operation of this conventional mask pattern layout sytem is described with reference to a flowchart of FIG. 10. First, previously designed LSI mask pattern data stored in the magnetic disc device 4 is read out in Step 10 by means of the CPU 1, a previously designed LSI mask pattern being displayed on the graphic display device 2 based upon the data thus read out. In the next Step 11, instructions to expand the hierarchical structure of the LSI mask pattern data are input through the keyboard device 3, the previously designed LSI mask pattern data being expanded in Step 12 into planar pattern data having no hierarchy.

Subsequently, in Step 13, compaction instructions for adapting the dimensions of the LSI mask pattern to the new design standards are input through the keyboard device 3, the planar previously designed LSI mask pattern data with no hierarchy being compaction-processed in Step 14 by the CPU 1.

New LSI mask pattern data which have been thus compaction-processed are stored in the magnetic disc device 4 by means of the CPU 1 while the mask pattern thereof is displayed on the graphic display device 2.

In the conventional mask pattern layout system described above, however, the hierarchical structure of previously designed LSI mask pattern data are expanded into planar pattern data before the mask pattern is compaction-processed, resulting in an enormous amount of data to be compaction-processed at one time, which requires an exceedingly time-comsuming operation.

SUMMARY OF THE INVENTION

This invention has been conceived with a view to eliminating this problem. It is accordingly the object of this invention to provide a method and a system for compaction-processing mask pattern data of a semiconductor integrated circuit device which make it possible to reduce the amount of data to be processed at one time and to conduct the compaction-processing of the mask pattern of a semiconductor integrated circuit device in a short time.

In accordance with this invention, there is provided a method for compaction-processing mask pattern data of a semiconductor integrated circuit device having a hierarchical structure composed of cells of the lowest to the highest level, the method comprising the steps of extracting inter-cell connection information from the mask pattern data for each cell level, and successively executing compaction-processing operations for cells of respective levels, from the lowest to the highest level, while retaining the connection between the cells at respective levels in accordance with the inter-cell connection information extracted.

This invention further provides a mask pattern layout system for a semiconductor integrated circuit device, comprising storage means for storing mask pattern data of a semiconductor integrated circuit device having a hierarchical structure composed of cells of the lowest to the highest level, connection information extracting means for extracting inter-cell connection information from the mask pattern data stored in the storage means for each cell level, and computing means for successively executing compaction-processing operations for cells of respective levels, while retaining the connection between the cells of each level in accordance with the inter-cell connection information extracted by means of the connection information extracting means.

DESCRIPTION OF THE PREFERRED EMBODIMENT

This invention will now be described with reference to the attached drawings.

Figure 1:
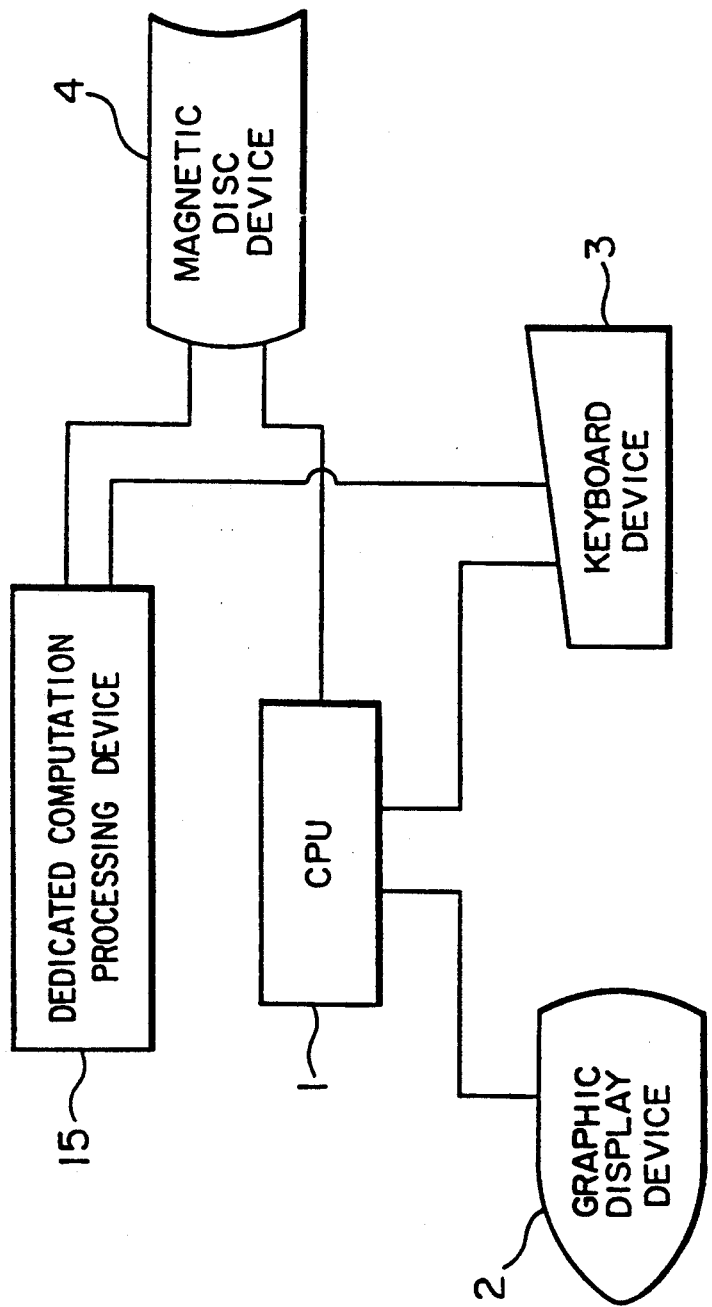
FIG. 1 is a block diagram illustrating, by way of example, an LSI mask pattern layout system used for executing the method of this invention.

As shown in FIG. 1, an LSI mask pattern layout system of this invention includes a CPU 1 which is connected to a graphic display of device 2 for display LSI mask patterns, a keyboard device 3 for inputting various instructions, and a magnetic disc device 4 for storing previously designed LSI mask pattern data and new design standards.

Figure 3:
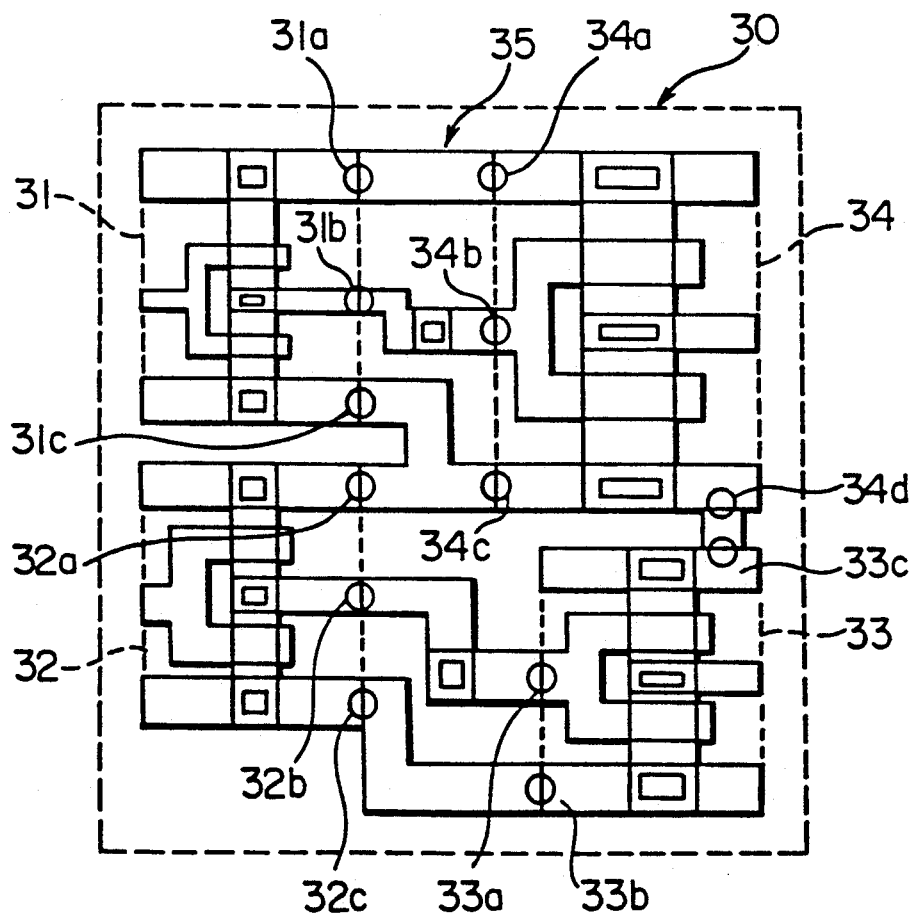
FIG. 3 is a plan view showing an example of LSI mask patterns.
Figure 4A:
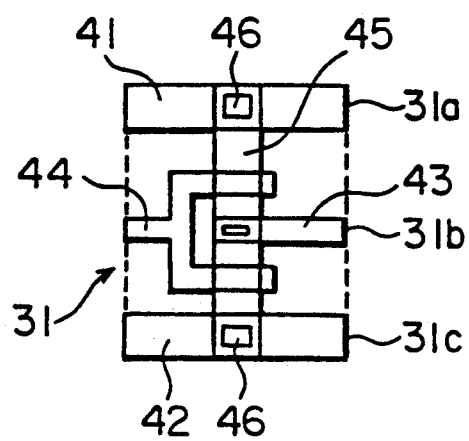
FIGS. 4A through 4D are plan views showing lower-level cells.
Figure 4B:
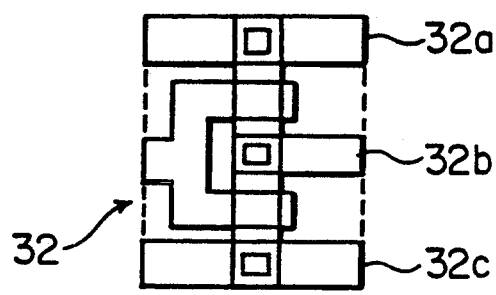
Figure 4C:
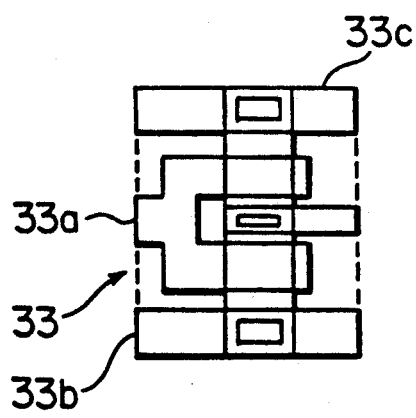
Figure 4D:
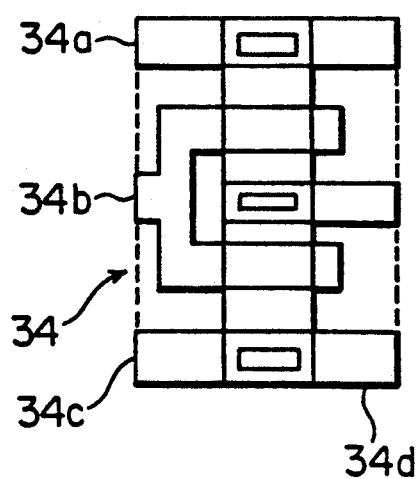
Figure 5:
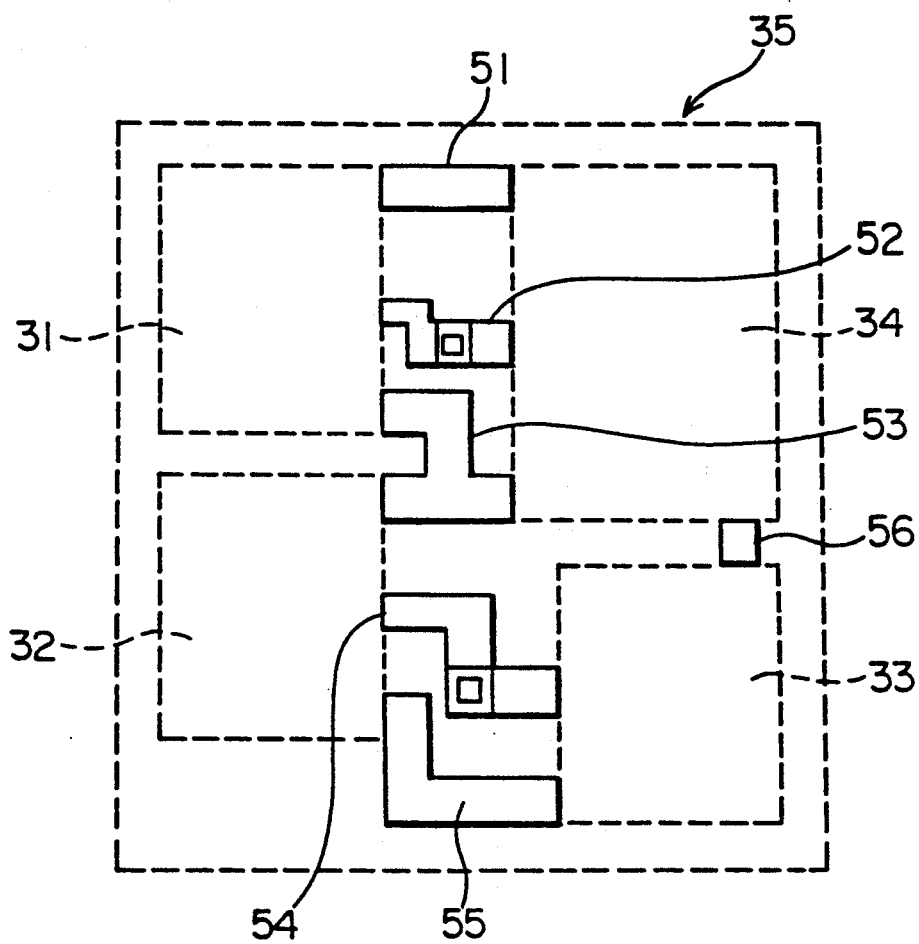
FIG. 5 is a plan view showing a higher-level cell.

The LSI mask pattern data stored in the magnetic disc device 4 represent, for example, an LSI mask pattern 30, which is shown in FIG. 3. This LSI mask pattern 30 has a double-layered hierarchical structure which is composed of lower-level cells 31 through 34 shown in FIGS. 4A through 4D, respectively, and an upper-level cell 35 having, as shown in FIG. 5, a wiring zone between these lower-level cells 31 through 34 containing an interconnection network of wiring lines. As shown in FIG. 4A the lower-level cell 31 includes a power line 41, a grounding line 42, an output line 43, each of which is made of Al, and an input line 44 made of polysilicon, and forms an inverter circuit composed of two transistors. The cell 31 further includes a diffused layer 45 and a contact hole 46. The other lower-level cells 32 through 34 have the same structure is this lower-level cell 31. In other words, the LSI mask pattern 30 of FIG. 3 has a combination of four inverter circuits.

Further, as shown in FIG. 1, a dedicated computation processing device 15 for extracting inter-cell connection information from the hierarchical LSI mask pattern data and performing the compaction-processing of each cell is connected to the keyboard device 3 and the magnetic disc device 4. This dedicated computation processing device 15 may include a computer.

The operation of this LSI mask pattern layout system will now be described with reference to the flowchart of FIG. 2.

First, previously designed LSI mask pattern data stored in the magnetic disc device 4 are read out in Step 20 by the CPU 1, and the LSI mask pattern 30 shown in FIG. 3 is displayed on the display device 2 using these data.

Subsequently, instructions for extracting inter-cell connection information from the LSI mask pattern data are input through the keyboard device 3 in Step 21, and the inter-cell connection information is extracted by the dedicated computation processing device 15 in Step 22. This inter-cell connection information can be obtained by examining the terminal positions of each cell as well as the terminal positions and the wiring condition of the cell which is higher by one level. Here, the connection information will be examined, by way of example, on the lower-level cell 31 shown in FIG. 4A. First, it will be appreciated, by examining the relation between this lower-level cell 31 and the upper-level cell 35 shown in FIG. 5 which is one level higher than the cell 31, that the three terminals 31a through 31c are connected to one of the ends of the wiring lines 51 through 53 of the interconnection network on the upper-level cell 35, respectively. Then, it is ascertained to which of the other lower-level cells 32 through 34 the other ends of these wiring lines 51 through 53 are connected. It will be found out through this that the other ends of the wiring lines 51 through 53 are respectively connected to the terminals 34a through 34c of the lower-level cell 34. Consequently, the following three pieces of connection information can be obtained about the lower-level cell 31:

Terminal 31a of cell 31 . . . terminal 34a of cell 34
Terminal 31b of cell 31 . . . terminal 34b of cell 34
Terminal 31c of cell 31 . . . terminal 34c of cell 34

By conducting a similar examination on the other lower-level cells 32 through 34, the following pieces of information can be obtained Terminal 32a of cell 32 . . . terminal 34c of cell 34
Terminal 32b of cell 32 . . . terminal 33a of cell 33
Terminal 32c of cell 32 . . . terminal 33b of cell 33
Terminal 33c of cell 33 . . . terminal 34d of cell 34

Figure 2:
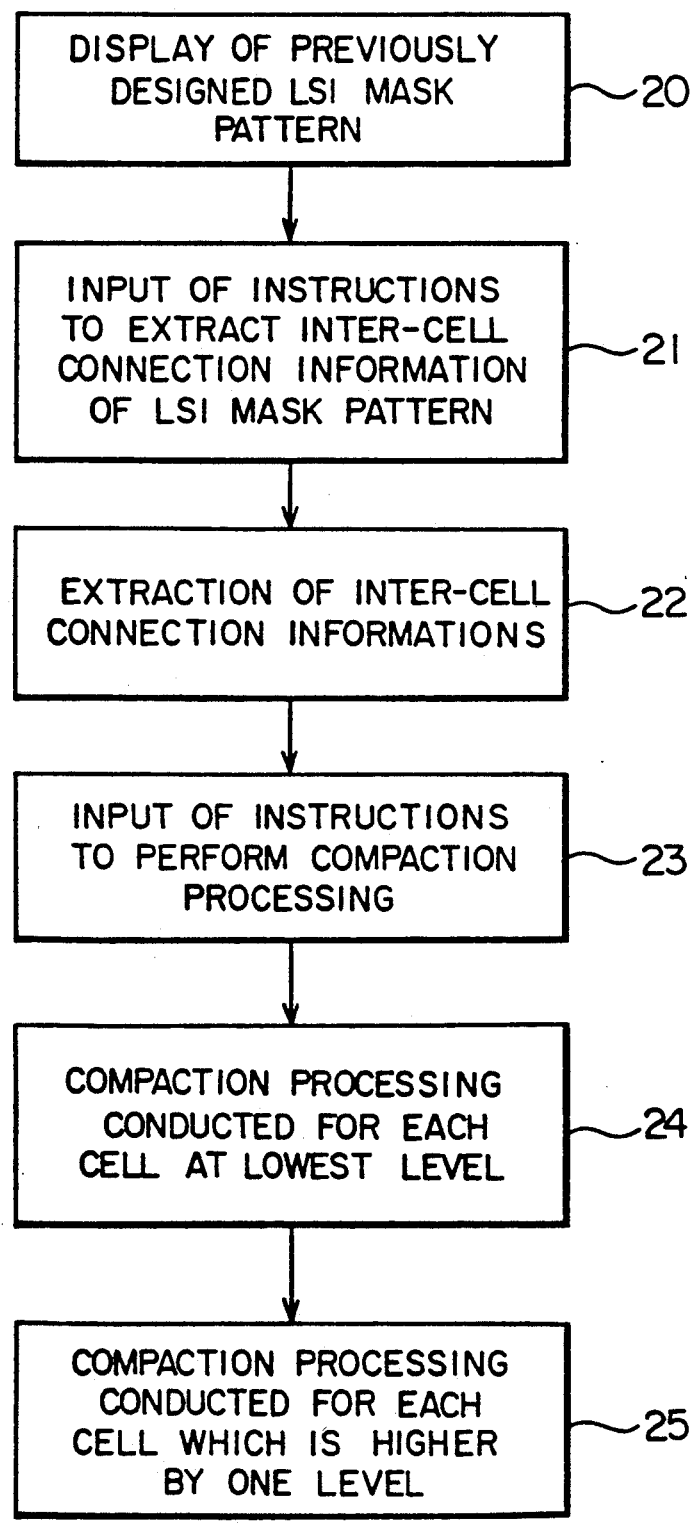
FIG. 2 is a flowchart illustrating the operation of the system shown in FIG. 1.

When the inter-cell connection information has been thus extracted, compaction instructions to adapt the dimensions of the LSI mask pattern to the new design standards stored in the magnetic disc device 4 are input through the keyboard device 3 in Step 23 of FIG. 2. As a result, the compaction-processing for each cell level is conducted by the dedicated computation processing device 15.

Figure 6:
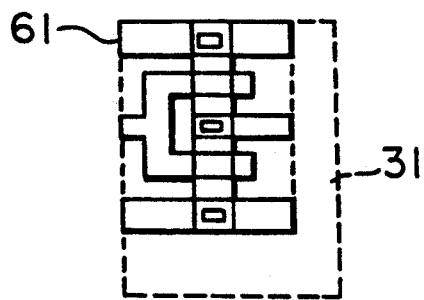
FIG. 6 is a plan view showing a compaction-processed lower-level cell.

First, the compaction-processing of the lower-level cells 31 through 34 is conducted for each cell in Step 24. As shown in FIG. 6, for example, the lower-level cell 31 is compaction-processed with to change its dimensions, i.e., to reduce its dimensions, according to a predetermined reduction ratio so that it may be adapted to the new design standards, thus becoming a new lower-level cell 61. Likewise, the other lower-level cells 32 through 34 are compaction-processed with respective reduction ratios, becoming new lower-level cells.

After that, a cell which is one level higher than the cells 31 through 34 is compaction-processed in Step 25. In other words, the upper-level cell 35 is compaction-processed so that it may be adapted to the new design standards. At this time, the compaction-processing of the upper-level cell 35 is conducted in accordance with the inter-cell connection information previously extracted in Step 22 so that the inter-cell connection of the lower-level cells before the compaction-processing may be retained.

Figure 7:
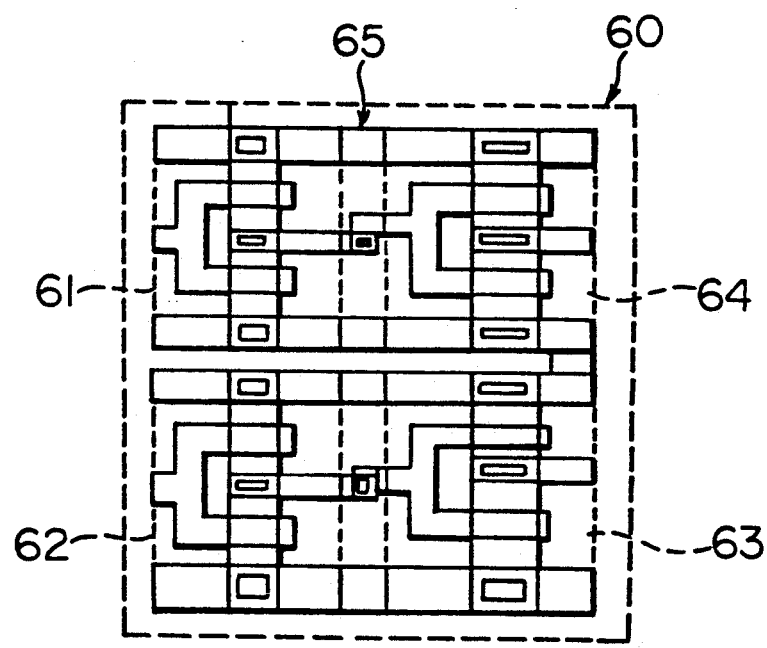
FIG. 7 is a plan view showing a compaction-processed LSI mask pattern.
Figure 8:
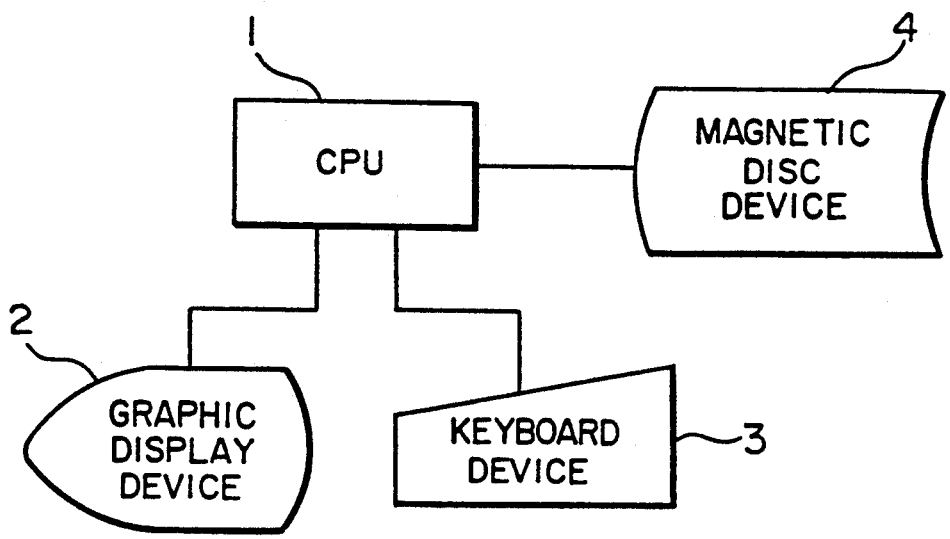
FIG. 8 is a block diagram illustrating a conventional LSI mask pa&tern layout system.
Figure 9:
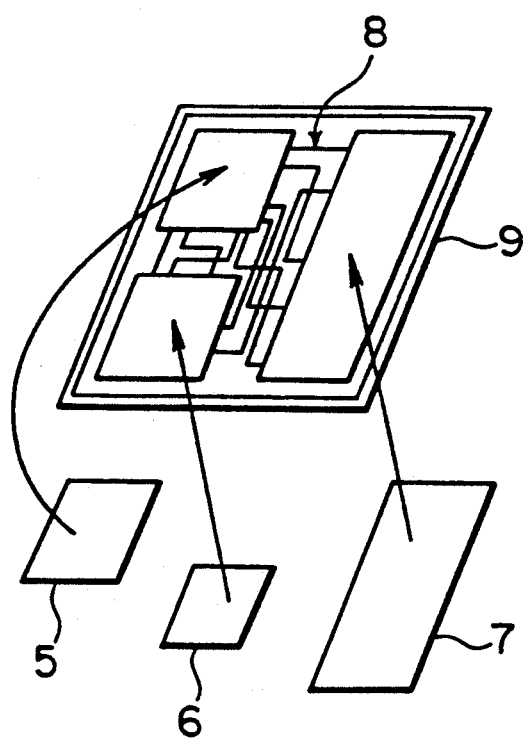
FIG. 9 is a schematic view showing the hierarchical structure of general LSI mask pattern data.
Figure 10:
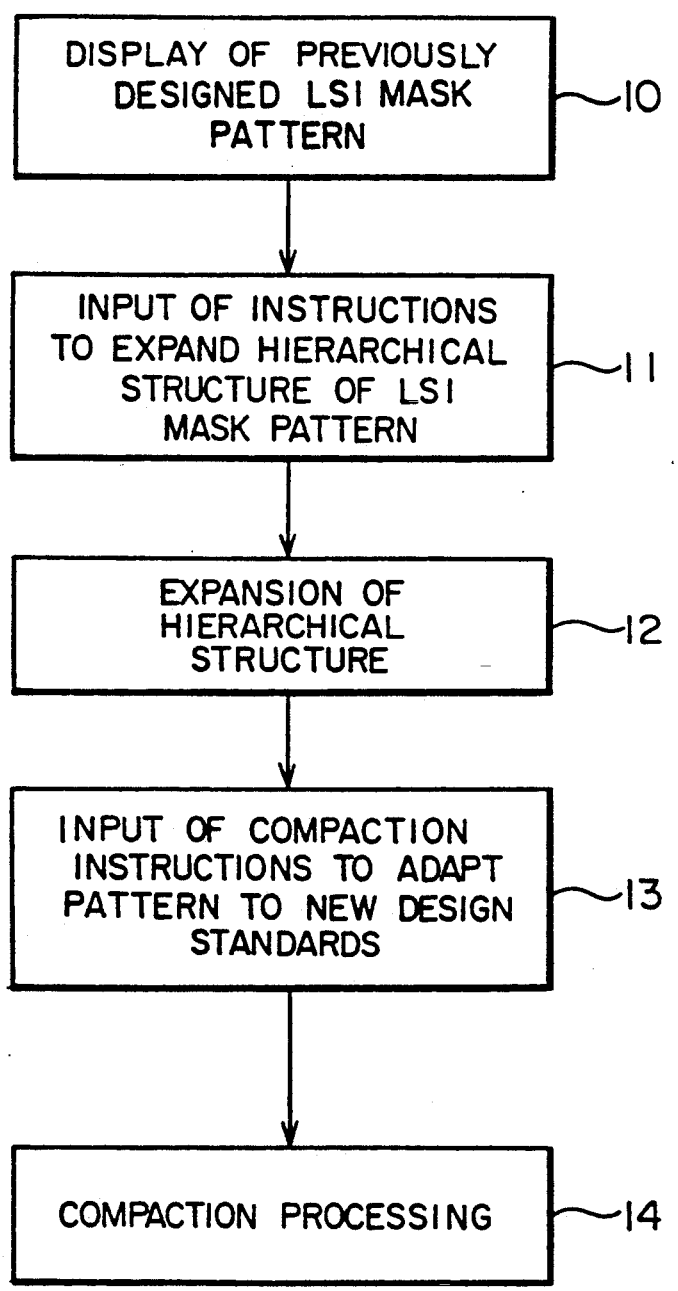
FIG. 10 is a flowchart illustrating the operation of the system shown in FIG. 8.

In this way, new LSI mask pattern data comprising compaction-processed cells are stored in the magnetic disc device 4 by the dedicated computation processing device 15. These LSI mask pattern data are read out by the CPU 1, the new LSI mask pattern 60 shown in FIG. 7 being displayed on the graphic display device 2. The drawing of FIG. 7 shows new lower-level cells 62 through 64 obtained by compaction-processing the lower-level cells 32 through 34 as well as a new upper-level cell 65 obtained by compaction-processing the upper-level cell 35.

Thus, LSI mask pattern data can be compaction-processed with the hierarchical structure thereof being retained. This results in a substantial reduction in the amount of data to be compaction-processed, which makes it possible to obtain LSI mask pattern data adapted to new design standards in a short time.

While in the above embodiment mask pattern data has a two-level hierarchical structure, the invention may be applied to data having a hierachical structure with more levels. In this case, the compaction-processing in Step 25 of FIG. 2 will be conducted successively for each level, up to the highest one.

Further, while in the above embodiment the extraction of the inter-cell connection information and the compaction-processing are performed by the dedicated computation processing device 15, they may also be conducted by the CPU 1. The dedicated computation processing device 15 will then be omitted.

While the above embodiment is shown as used for the pattern of an inverter circuit, it will of course be understood that the present invention is not restricted to that. Further, this invention can be applied not only to LSI patterns, but also to the patterns of other types of semiconductor integrated circuit devices.

What is claimed is:

1. A method for producing a mask pattern for a semiconductor integrated circuit comprising:

reading mask pattern data for the integrated circuit from a storage device of an LSI (large scale integration) mask pattern layout system, the mask pattern data having dimensions according to a first design standard;

dividing the mask pattern data into a plurality of units including a plurality of lower level cells having terminal positions and an upper level cell including terminal positions for contacting the terminal positions of the lower level cells and wiring lines running between the terminal positions of the upper level cell to provide a first interconnection network;

extracting inter-cell connection information from the mask pattern data;

changing the dimensions of the lower level cells according to predetermined ratios to produce compaction-processed lower level cells having terminal positions and dimensions according to a second design standard, the dimensions according to the second design standard being different from the dimensions according to the first design standard; and compaction-processing the upper level cell according to the inter-cell connection information to produce a new upper level cell including terminal positions for contacting the terminal positions of the compaction-processed lower level cells and including wiring lines running between the terminal positions of the new upper level cell to provide a second interconnection network equivalent to the first interconnection network.

2. A method as recited in claim 1 wherein extracting includes examining the terminal positions of each of the lower level cells and the terminal positions of the upper level cell to identify, for each terminal position of each lower level cell, wiring lines connected to each terminal position of the upper level cell for making contact with each terminal position of each lower level cell.

3. A method as recited in claim 2 wherein examining includes ascertaining, for each terminal position of the upper level cell, to which of the lower level cells the terminal position is connected.

* * * * *